United States Patent [19]

Nakagawa et al.

[11] Patent Number: 4,865,709
[45] Date of Patent: Sep. 12, 1989

[54] MAGNETRON SPUTTER APPARATUS AND METHOD FOR FORMING FILMS BY USING THE SAME APPARATUS

[75] Inventors: Yukio Nakagawa, Katsuta; Ken-ichi Natsui; Youichi Ohshita, both of Hitachi; Tadashi Sato, Mito; Eiji Setoyama; Mitsuhiro Kamei, both of Hitachi, all of Japan

[73] Assignee: Hitachi, Ltd., Tokyo, Japan

[21] Appl. No.: 207,537

[22] Filed: Jun. 16, 1988

[30] Foreign Application Priority Data

Jun. 16, 1987 [JP] Japan ............................... 62-147867
Oct. 5, 1987 [JP] Japan ............................... 62-249834

[51] Int. Cl.$^4$ ............................................. C23C 14/34
[52] U.S. Cl. ............................ 204/192.12; 204/192.2; 204/298
[58] Field of Search ............... 204/192.12, 298 ME, 204/298 PM, 192.2

[56] References Cited

U.S. PATENT DOCUMENTS

| 4,025,410 | 5/1977 | Stewart | 204/192.12 |
| 4,581,118 | 4/1986 | Class et al. | 204/298 |

FOREIGN PATENT DOCUMENTS

| 59-53679 | 3/1984 | Japan | 204/298 |
| 61-288067 | 12/1986 | Japan | 204/298 |
| 62-119907 | 6/1987 | Japan | 204/298 |

Primary Examiner—Aaron Weisstuch
Attorney, Agent, or Firm—Antonelli, Terry & Wands

[57] ABSTRACT

A magnetron sputter apparatus according to the present invention is constructed so as to satisfy a predetermined optimum relationship between the size of the erosion area on the surface of the target and that of a film forming region. Further, the distance between the target and substrates has a value predetermined for the relationship between the size of the erosion area on the surface of the target and that of the film forming region. By using the magnetron sputter apparatus according to the present invention it is possible to form a homogeneous thin film excellent in step coverage and having a film thickness distribution in which variations are small over a large area.

17 Claims, 9 Drawing Sheets

FILM FORMING REGION: 80 × 320

FIG. 10

FILM FORMING REGION: 80 × 500

MAGNETRON SPUTTER APPARATUS AND METHOD FOR FORMING FILMS BY USING THE SAME APPARATUS

BACKGROUND OF THE INVENTION

The present invention relates to a magnetron sputter apparatus and a method for forming films by using the same, and in particular to a magnetron sputter apparatus and a method for forming films by using the same, which are suitable for depositing a homogeneous film on a region having a large area such as a magnetic thin film necessary for a thin film magnetic head, etc.

In a prior art sputter apparatus for simultaneously forming films on a plurality of substrates arranged in a region having a large area the films are formed on a substrate which is located opposite the center of a target, are a plurality of substrates are arranged in coaxial circles, and in addition the target is circular, as disclosed e.g. in JP-A-56-130470. In the case where films are formed simultaneously on a plurality of substrates, it has been believed that it is preferable to arrange them in a film forming region, which is circular or rectangular, in order to obtain a good film thickness distribution, from the point of view of the symmetry. Further a magnetron sputter apparatus using a rectangular target is disclosed in JP-A-58-189372. However, substrate arrangement size of the film forming region further and size of the target erosion area are not indicated in this literature. In these examples of the prior art techniques, neither shape nor size of the erosion area, which have important influences on film forming characteristics such as the film thickness distribution in the film forming region, the ratio of the film thickness on an inclined portion to that on a flat portion (step coverage), presence of an inclined portion, etc., are known and therefore they are not described.

It is believed that it is difficult to increase the productivity and to stabilize the film quality by forming simultaneously films on a plurality of substrates by means of a magnetron sputter apparatus according to the prior art techniques described above, and such techniques are not known. In particular, no knowledge was obtained concerning the size of the film forming region, the size of the target erosion area and the film forming characteristics in a magnetron type sputter apparatus, specifically from the point of view of improving the film thickness distribution in a large area; and no magnetron sputter apparatus was provided, which was capable of depositing simultaneously a film having an excellent film thickness distribution and uniform characteristics on a plurality of substrates arranged in a large area.

Furthermore, no attention has been paid to the case where the magnetic film has an inclined portion such as in a magnetic head, and there is a problem that good step coverage can not be obtained.

SUMMARY OF THE INVENTION

The present invention has been made in view of the problems described above and the object thereof is to provide magnetron sputter apparatus and a method for forming films by using the same, which are capable of simultaneously depositing a film having an excellent film thickness distribution over a large area and uniform characteristics on a plurality of substrates, obtaining a good step coverage even if the film includes an inclined portion, or realizing both objects simultaneously.

According to the present invention the above objects can be achieved by;

a magnetron sputter apparatus, in which a plurality of substrates are located on a straight line along the longitudinal direction of an erosion area having shorter and longer sides formed by magnetron magnetic field on a target surface, each of the substrates being located between two adjacent permanent magnets disposed with a predetermined interval on a substrate holder;

a magnetron sputter apparatus, in which the size of the longer side of the erosion area formed by the magnetron magnetic field on the target surface is greater than the value obtained by subtracting the distance between the target and the substrates from the length in the longitudinal direction of a film forming region enveloping the substrates;

a magnetron sputter apparatus, in which the size "a" of the shorter side of the erosion area formed by the magnetron magnetic field on the target surface is given by:

$$a = as\left(1.7 + \frac{as}{bs} \times \frac{Ds - as}{10}\right) \pm \tfrac{1}{2}Ds$$

where "as" represents the size of the shorter side of the film forming region enveloping the substrates, "bs" the size of the longer side thereof, and "Ds" the distance between the target and the substrates;

a magnetron sputter apparatus, in which, in the case where the film deposited on the substrate has in part an inclined portion, for which a sufficient film thickness is required, is arranged in the longitudinal direction of the erosion area formed by the magnetron magnetic field on the target surface, or when a straight line is traced, which passes through a longer side portion A of the erosion area formed by the magnetron magnetic field on the target surface and a portion P of the film forming region of the substrate, which is farthest from the longer side of the erosion area in the direction perpendicular to the longer side, the length of the segment AP being L, and a line perpendicular to the erosion area region is drawn towards the target, the angle formed by the perpendicular line and the straight line AP being $\theta$, L/$\theta$ has a value determined by 4±0.3, L being expressed in mm and $\theta$ in degree;

a magnetron sputter apparatus, in which, when the length of the shorter side of the film forming region enveloping the substrates is represented by "d" (mm), the shorter side of the erosion area (such area having shorter and longer sides) formed by the magnetron magnetic field on the target surface has a width "a" (mm) given by:

$$2d\left(\frac{\alpha}{3}\right)^{\tfrac{1}{4}} - 40 \leq a \leq 2d\left(\frac{\alpha}{3}\right)^{\tfrac{1}{4}} + 40 \text{ (mm)}$$

where $\alpha = d/25.4$;

a magnetron sputter apparatus, in which the length of the erosion area is b given by;

$$b \geq n(d+15) + 50 \text{ (mm)}$$

where n represents a number of the substrates and the length of the film forming region enveloping the substrates is d (mm);

a film forming method, by which a deposited film is formed simultaneously on a plurality of substrates arranged approximately on a straight line, each of which is located between two adjacent permanent magnets positioned with a predetermined interval, in a state where a unidirectional magnetic field is formed on the surface of the substrates so that the magnetic field produced by the permanent magnets is approximately parellel to the direction of the substrate arrangement; or a film forming method, by which a parallel magnetic field is applied in the direction perpendicular to the direction of the substrate arrangement by means of at least a pair of permanent magnets disposed along the arrangement direction on both sides of a plurality of the substrates arranged on a straight line, and a deposited film is formed simultaneously on the substrates in the state where a unidirectional magnetic field is formed on the surface of the substrates.

That is, the inventors of the present invention have effected various experimental and analytical studies in order to achieve the above object by using a magnetron sputter apparatus for depositing a magnetic film used in a thin film magnetic head and found as the result that it is efficient to form the film on a plurality of substrates arranged approximately in a straight line. In particular, in the case where the film forming region is rectangular or has a shape similar to a race track, it was found also that the film thickness distribution of the sputtered film deposited in a film forming region having a large area is varied by varying the width and the length of the erosion area (the distribution being determined by the maximum and the minimum film thicknesses on the substrates located in the region described above and showing that the smaller the film thickness distribution is, the more uniform the film thickness is) and also that the step coverage varies with varying width of the erosion area. The inventors of the present invention have brought the present invention to completion, based on this new knowledge. That is, in a magnetron sputter apparatus having a rectangular erosion area in a rectangular target, in which a plurality of substrates are arranged on a straight line, the width and the length of the erosion area are restricted in a certain domain determined by a relation between the width and the length of a rectangle enveloping the desired film forming region.

BRIEF DESCRIPTION OF THE DRAWING

FIG. 2 shows characteristic curves indicating the relation between the length of the longer side of the erosion area and the film thickness distribution in the case where a rectangular domain is set for the film forming region;

DESCRIPTION OF THE PREFERRED EMBODIMENTS

Hereinbelow a magnetron sputter apparatus and a method for forming films using the same, according to the present invention, will be explained on the basis of an embodiment illustrated in FIGS. 1 and 2.

Figure 1:
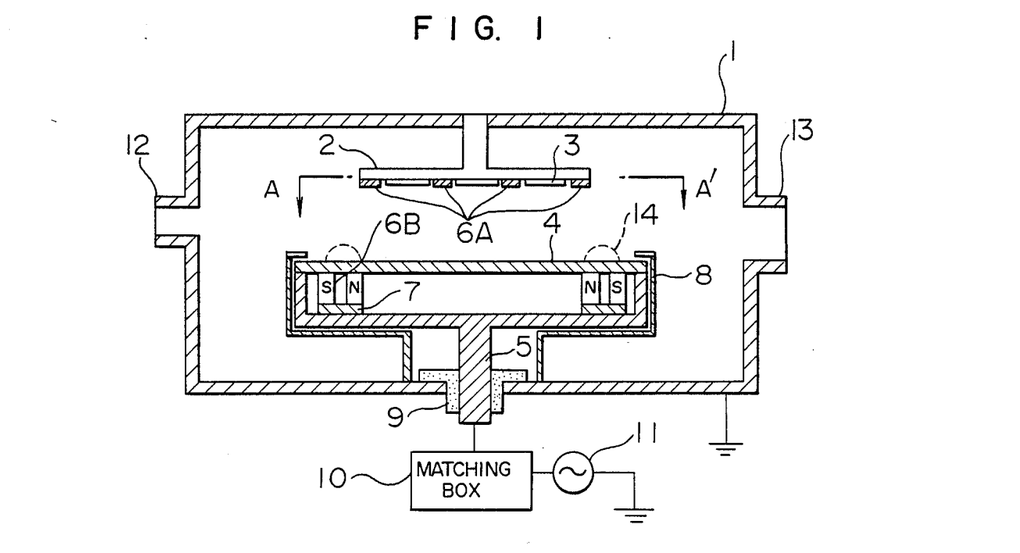
FIG. 1 is a cross-sectional view showing an embodiment of the magnetron sputter apparatus according to the present invention.
Figure 2:
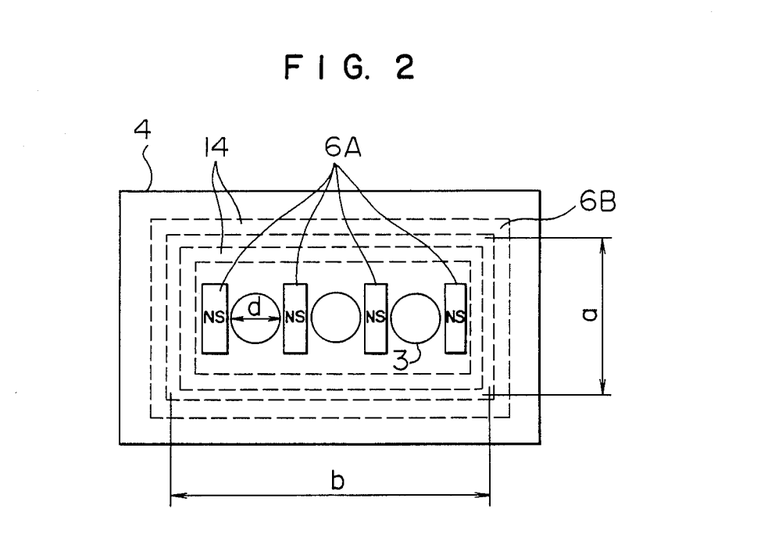
FIG. 2 is a top view seen from A—A' in FIG. 1.

FIGS. 1 and 2 illustrate and construction of a magnetic sputter apparatus according to the present invention, which is used for depositing a magnetic film for a thin film magnetic head.

As indicated in FIG. 1, within a vacuum chamber 1 there are disposed a plurality of substrates 3 fixed on a substrate holder 2 and arranged approximately on a straight line. Each of these substrates 3 is located between two adjacent permanent magnets 6A disposed with a predetermined interval on the substrate holder 2. On the other hand, a target 4 is secured to a target holder 5 opposite to the substrates 3. On the side of target 4 opposite to the substrates 3 there are disposed a pair of permanent magnets 6B so that different magnetic poles are juxtaposed and a yoke 7 forms a magnetic circuit at one end of the magnets. Further, a ground sheild 8 is disposed so as to surround the target 4. The target holder 5 is insulated from the vacuum chamber 1 by an insulator 9 and at the same time connected with a power source 11 through a matching box 10. The vacuum chamber 1 is at ground potential and consequently the substrate holder 2 is at ground potential similarly to the vacuum chamber 1. Usually the target 4 and the target holder 5 are joined hermetically, and the permanent magnets (hereinbelow called magnetron magnets)

6B and the target 4 are cooled by water flowing in piping (not shown in the figure) in the interior of the target holder 5. Further, a pipe 12, through which sputter gas such as Ar, etc. is supplied to the vacuum chamber 1, and another pipe 13 connected with an exhausting apparatus such as a cryopump, etc. for exhausting the interior are connected to the vacuum chamber 1. Now the process, by which a sputtered film is formed on the substrates 3, by means of the apparatus according to the present invention, will be explained. At first, after the vacuum chamber 1 has been exhausted to a high vacuum on the order of $1.3 \times 10^{-5}$ Pa through the pipe 13 by means of the exhausting apparatus, sputter gas such as Ar, etc. is supplied through the pipe 12 thereto so that the pressure in the vacuum chamber 1 is kept to a value on the order of $1.3 \times 10^{-2}$ Pa. At this time, the target 4 is fed with electric power from the high frequency power source 11 of 13.56 MHz. As a result, plasma discharge is produced between the target 4 and the substrate holder 2. On the surface of the target 4 magnetic field 14 of the magnetron magnets 6B forms a tunnel of magnetic field lines as indicated by the broken lines in FIG. 2. In this way, electrons in the plasma are enclosed in the magnetic field by electro-magnetic force and produce a high density plasma, in which the frequency of collisions with gas molecules is high. Although the target 4 can be made of any material, it is made of permalloy, which is a magnetic substance, in this embodiment.

Positively charged ions in the plasma collide with the target 4 acting as the cathode and particles constituting the target 4 are ejected, forming sputtered particles. They adhere to the substrates 3, which are usually in a heated state, and a film is grown thereon. At this time, the sputtering phenomenon is accelerated between the pair of the magnetron magnets 6B and erosion of the target is great there. Thus the width "a" and the length "b" of the erosion area are defined, based on the center lines between the pair of the magnetron magnets 6B. FIG. 2 is a plan view of the substrates, seen from A—A' in the direction indicated by the arrows. As indicated in this figure, in this embodiment a plurality of substrates 3 (here three substrates are indicated, but there may be more) are located approximately along a straight line connecting the middle points of the shorter sides of a rectangular erosion area.

Furthermore, in this embodiment, as described previously, in order to induce a uniaxial anisotropy in the magnetic film deposited on the substrates 3, permanent magnets 6A are disposed on the substrate holder 2 and each substrate 3 is located between two adjacent permanent magnets 6A. The magnetic field produced by the permanent magnets 6A is approximately parallel to the direction of the substrate arrangement and the permanent magnets 6A form a unidirectional magnetic field on the surface of the substrates. In this way an anisotropy, including the easy magnetization axis and the difficult magnetization axis with respect to an external magnetic field, is induced in the magnetic film deposited on the substrates 3 and writing-in and reading-out characteristics, which are excellent as a core material for a magnetic head, can be obtained.

In addition, when a magnetic head is fabricated, there is an inclined portion in the magnetic film. If the film thickness on this inclined portion is significantly small with respect to that on the flat portion, the magnetic density is saturated at this portion and therefore no satisfactory writing-in and reading-out characteristics can be obtained. In practice, it is experimentally confirmed that required characteristics can be obtained if the film thickness on the inclined portion is greater than 70% of that on the flat portion.

Figure 3:
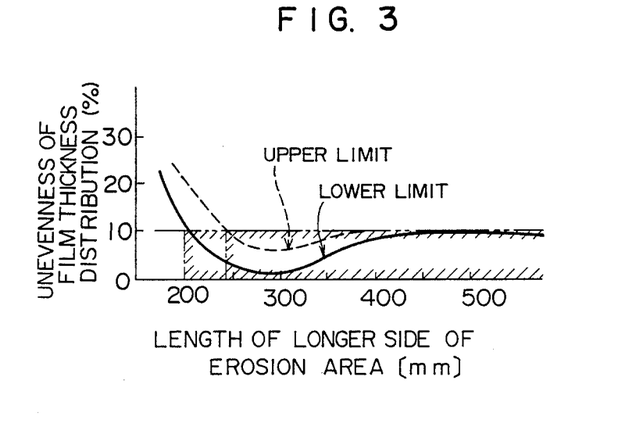

FIG. 3 indicates results obtained by calculating, in the case where a rectangular domain 80 mm wide and 320 mm long is set as the required film forming region on the substrate holder 2, how the film thickness distribution within the rectangular film forming region described above varies with respect to the length of the longer side of the erosion area (b in FIG. 2). The calculation has been effected for a domain of the width of the erosion area (a in FIG. 2) varying from 100 mm to 260 mm and a domain of the distance Ds between the target 4 and the substrates 3 varying from 60 mm to 120 mm. This calculation has been effected, with the supposition that particles sputtered from all the periphery of the erosion area reach all the parts of the film forming region and are deposited there, on the basis of measured results of emission angular distribution characteristics of sputtered particles, and it is experimentally confirmed for several examples that these calculation results are in good accordance with measured results.

As the result of calculations effected on combinations of various conditions described above, it was understood that the characteristics thereof can be represented by the regions enclosed by the full and the broken lines in FIG. 3. That is, in the case where the distance Ds between the target and the substrates, and the width a of the erosion area, are within the domains described previously, it was confirmed that either combination gives characteristics such that the film thickness distribution is at a minimum around 300 mm for the length b of the longer side of the erosion area, that it is almost constant for lengths greater than 450 mm, and that it becomes rapidly worse for lengths smaller than 250 mm.

In the case where a film forming region of about 80 mm × 320 mm is presumed, it is believed that in view of industrial utilization the calculation domains described above for the size of the magnetron sputter apparatus are sufficient. Although still greater widths a of the erosion area and the distances Ds between the target and the substrates, are possible, they are not suitable for practical applications.

Figure 4:
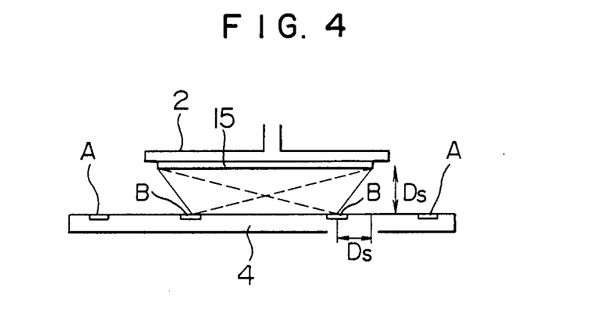
FIG. 4 is a side view of a magnetron sputter apparatus, in which the shorter sides of the erosion area and the film forming region are viewed from the front.
Figure 5:
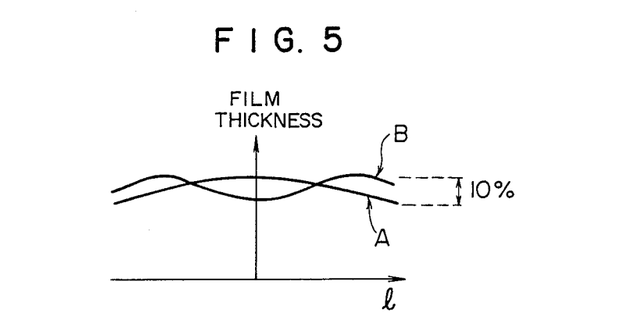
FIG. 5 shows film thickness distribution characteristics in the direction of the longer side of the film forming region, at the shorter side of the erosion area.

The characteristic minimum with respect to the length b of the erosion area, as indicated in FIG. 3, is due to the contribution of sputtered particles from the shorter side of the erosion area. FIG. 4 is a side view of the target 4 and the film forming region 15 on the substrate holder 2, which are arranged so that the shorter sides are viewed from the front. FIG. 5 indicates film thickness distributions within the film forming region 15 along the longer side, in the cases where the shorter side of the erosion area is positioned at A and B, respectively. The curve indicated by A in FIG. 5 represents the film thickness distribution in the case where the shorter side of the erosion area is located at A in FIG. 4 which shows that the film thickness decreases monotonically from the central portion to the end portions of the longer side. On the contrary, in the the shorter side of the erosion area is located at B in FIG. 4 the distribution shows two maxima. This is due to the effect that sputtered particles coming from the shorter sides of the erosion area are deposited there, which increases the film thickness in the neighborhood of the erosion area B.

In industrial practice it is required to restrict variations in the film thickness distribution to about 10%. As explained above, for the length b of the longer side of the erosion area satisfying the above condition there are two types of distributions, one in which the erosion area is longer than the longer side of the film forming region and the other in which the former is shorter than the latter.

From FIG. 3 it can be understood that, in order to fulfill the restriction that variations in the film thickness distribution are smaller than 10%, if the length of the longer side of the erosion area is greater than about 240 mm with respect to the upper limit characteristics and about 200 mm with respect to the lower limit characteristics, there is no limit for the length of the erosion area in the longitudinal direciton. The value of the lower limit of the longer side of the erosion area depends on how much the erosion area can be positioned towards the center from the end portion of the film forming region 15, and this value is closely related to the distance Ds between the target 4 and the substrate 2. According to these calculations it was determined that it is most suitable to locate the erosion area at a position shifted towards the center by a distance approximately equal to the distance Ds between the target 4 and the substrates 2 from the end portion of the film forming region 15.

Summarizing the results described above, when a rectangular erosion area is chosen from a rectangular film forming region enveloping a required film forming region, it is preferable that the length of the longer side of the rectangular erosion area be greater than the difference obtained by subtracting the distance Ds between the target 4 and the substrates 3 from the length of the film forming region.

Now a method for selecting the width a of the erosion area will be explained.

Figure 6:
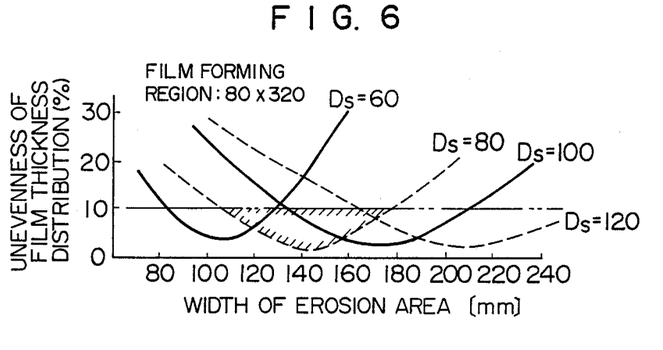
FIGS. 6 and 7 show film thickness distribution characteristics along the width of the erosion area with a parameter of the interval between the target and the substrates.
Figure 7:
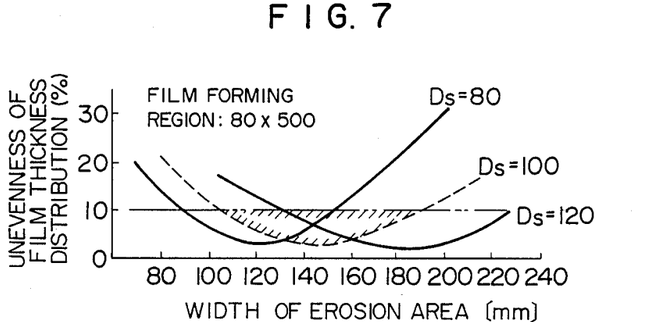

FIGS. 6 and 7 show film thickness distribution characteristics with respect to the width a of the erosion area, using the distance Ds between the target 4 and the substrates 3 as a parameter. That is, FIG. 6 shows results obtained in the case where the dimensions of the film forming region are 80 mm×320 mm, and FIG. 7 those obtained in the case where the dimensions thereof are 80 mm×500 mm. When a substrate holder 2 having a construction as indicated in FIG. 1 is used, it is possible to locate three and five substrates 3 having a diameter of 3″ thereon, respectively.

FIG. 6 shows film thickness distribution characteristics calculated for the case where the distance Ds between the target 4 and the substrates 3 is between 60 mm and 120 mm. The width a of the erosion area, whose film thickness distribution has a minimum value, as well as the width satisfying the condition that unevenness of the film thickness distribution is smaller than 10%, increase with increasing Ds. For example, in the case where Ds =80 mm, the film thickness distribution is minimum at a=140 mm and the domain, where it is smaller than 10%, is about ±40 mm wide around a=140 mm. In the case where Ds=100 mm, it is about ±50 mm wide around a=180 mm. Also in FIG. 7, for which the film forming region is wider, the characteristics are similar to those described above. That is, in the case where Ds=100 mm, the region ±50 mm wide around a=150 mm satisfies the condition that unevenness of the film thickness distribution is smaller than 10%.

Summarizing the results described above, concerning the width a of the erosion area, with which it is possible to obtain the required film thickness distribution relating to the dimensions of the film forming region (a film forming region "as" wide and "bs" long) and the distance Ds between the target 4 and the substrates 3, the following inductive relationship can be obtained;

$$a = as\left(1.7 + \frac{as}{bs} \times \frac{Ds - as}{10}\right) \pm \tfrac{1}{2}Ds.$$

When as/bs decreases, i.e. the length of the film forming region increases, if the distance between the target 4 and the substrates 3 remains the same, this relationship indicates that it is possible to decrease the width a of the erosion area, although the decrease is small, and that it is advantageous for the design of the apparatus to elongate the film forming region along a straight line.

Figure 8:
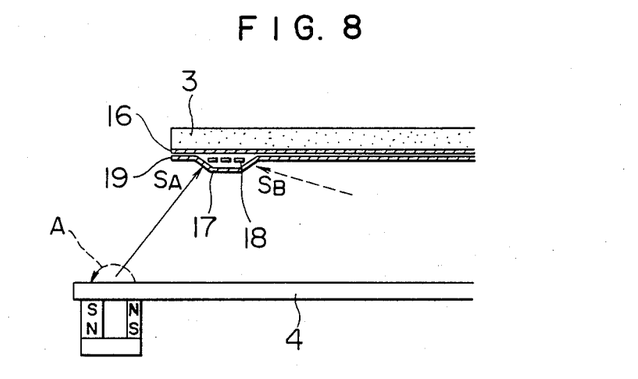
FIG. 8 is a partial cross-sectional view for explaining the step coverage in the case where the magnetic film has an inclined portion.

Although, in the above, the dimensions of the erosion area have been defined from the point of view of the film thickness distribution in the case where the film is deposited on flat substrates, in the case where a magnetic head is fabricated, as indicated schematically in an enlarged scale in FIG. 8, it is necessary to form a flat magnetic film (lower magnetic film) 16 on a substrate 3, to dispose a coil 18 in an insulator 17 and to deposit an upper magnetic film 19 thereon. This gives rise to inclined portions in the upper magnetic film 19 at the part over the coil 18 and it is important to secure a satisfactory film thickness at these inclined portions. Sufficient sputtered particles are deposited on the inclined surface $S_A$ facing the erosion area A. However, deposition from the erosion area A on the inclined surface $S_B$, which is on the opposite side, is insufficient and the deposition thereon can be effected, relying only on sputtered particles coming from the other erosion area, which is farther away. The deposition speed of sputtered paticles coming from the farther erosion area is lower and thus the film thickness on this side is smaller.

Figure 9:
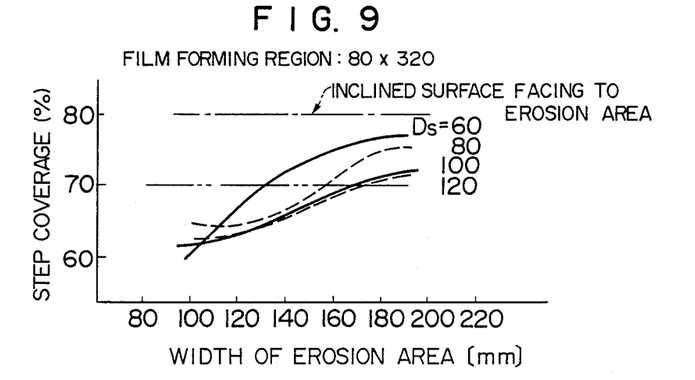
FIGS. 9 and 10 show step coverage characteristics along the width of the erosion area with a parameter of the interval between the target and the substrates.
Figure 10:
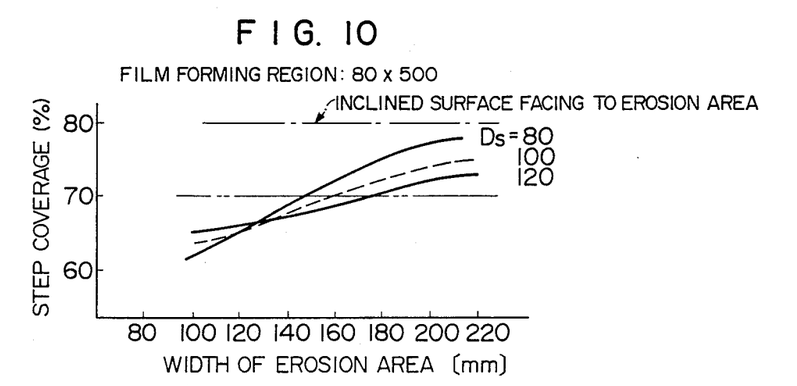

FIGS. 9 and 10 show step coverage characteristics with respect to the width of the erosion area, using the distance Ds between the target 4 and the substrate 3 as a parameter. FIG. 9 shows those for a film forming region of 80 mm×320 mm and FIG. 10 those for another film forming region of 80 mm×500 mm. In both cases there are shown characteristics that the step coverage increases with increasing width of the erosion area, and further it is indicated that the step coverage increases with decreasing distance Ds between the target 4 and the substrates 3.

Figure 11:
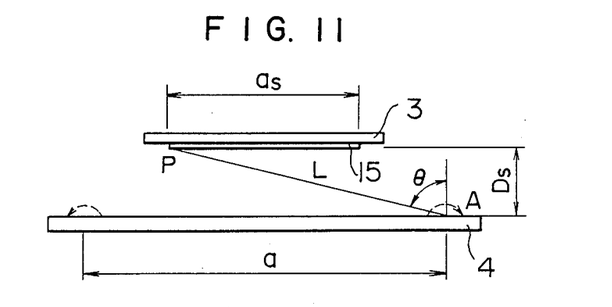
FIG. 11 is a scheme for explaining the relation between the step coverage and the geometry of the target and the substrates.

The step coverage is determined by the relation between a point A in the erosion area and a point P, which is farthest in the film forming region 15 therefrom, as indicated in FIG. 11. That is, the step coverage depends on the distance L between the point A in the erosion area and the point P, which is farthest in the film forming region 15 therefrom, and the angle $\theta$ formed by the perpendicular line to the target 4 and the straight line AP and the step coverage remains the same, if these factors remain the same.

It is experimentally confirmed that, in practice, excellent characteristics for a magnetic head can be obtained, if a step coverage greater than 70% is secured. It was understood that, in FIGS. 9 and 10, examining combinations of lengths L of the segment AP and angles $\theta$ in view of obtaining conditions for securing a step coverage greater than 70%, the value of $L/\theta$ may be between 3.7 and 4.3.

That is, in order to secure a step coverage greater than 70%, it is preferable that the ratio (L/θ) of the distance between a longer side of the erosion area and one of the longer sides of the film forming region, which is farther therefrom, to the emission angle of sputtered particles has a predetermined value.

On the other hand, it is known that influences of the length of the erosion area on the step coverage are negligibly small when unevenness in the film thickness distribution is smaller than 10%. Therefore, the conditions to secure good step coverage is that the width a of the erosion area and the distance Ds between the target and the substrates are selected so that L/θ is equal to 4 in FIG. 11, as explained above.

In FIGS. 9 and 10 the dot-dashed line indicates the step coverage on the inclined surface ($S_A$ in FIG. 8) facing the erosion area and it can be seen that the step coverage is greater than 80% for all cases. Utilizing these characteristics, in the case where a satisfactory step coverage should be secured for one of the two inclined surfaces, the pattern may be so formed that that inclined surface faces the nearer erosion area. In particular, for the magnetic head, since the side thereof, where there is a head gap, is narrower, the magnetic film is easily saturated there. Consequently it is efficient to arrange the magnetic head at the formation of the head pattern so that the inclined surface, where there is the head gap, faces the nearer erosion area.

Figure 12:
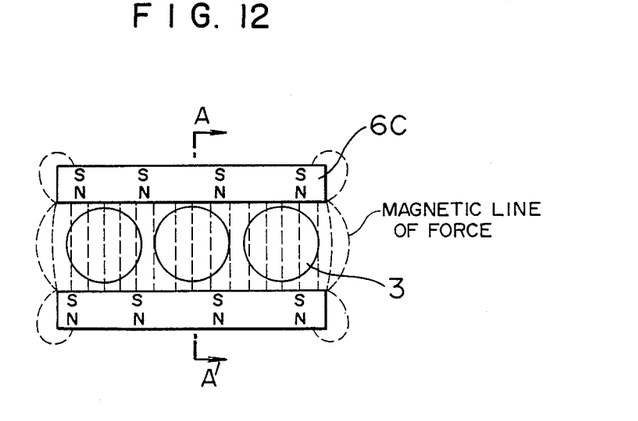
FIG. 12 is a top view of another example of the arrangement of the substrates and permanent magnets, corresponding to FIG. 2.

Now another example of an arrangement of the permanent magnets for inducing the uniaxial magnetic anisotropy in the magnetic film deposited on the substrate is shown in FIG. 12. In this example at least a pair of permanent magnets 6C (including the case where the permanent magnets are divided) are disposed on both the sides of the substrates 3 along the longitudinal direction of the straight line arrangement and a parallel magnetic field (perpendicular to the longitudinal direction) is applied to the substrates 3. In this way it is possible to induce a uniaxial magnetic anisotropy in the magnetic film formed on the substrates 3. Consequently, even if the number of substrates 3 is increased, it is possible to apply a uniform magnetic field to the substrates 3 by varying the length of the permanent magnets 6C. Furthermore, in this way it is possible to reduce the length in the longitudinal direction, with respect to that required in the case where the permanent magnets 6A indicated in FIG. 2, described previously are disposed.

Figure 13:
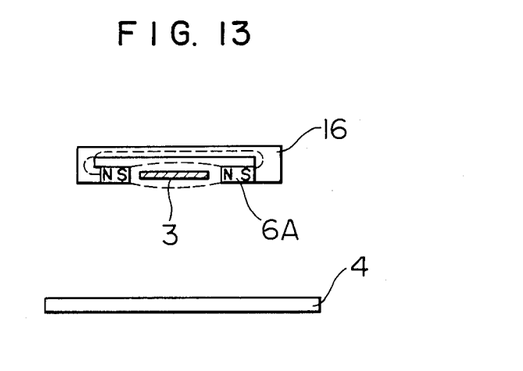
FIG. 13 is a scheme for explaining a case where a magnetic body is disposed in an embodiment of the present invention so as to form a magnetic circuit.

Furthermore, as indicated in FIG. 13, a magnetic body 16 is disposed on the outer side of the permanent magnet 6A, i.e. on the side thereof opposite the target 4, so as to form a magnetic circuit, which can reduce influences of the leakage magnetic field from the permanent magnets 6A on the plasma generated between the substrates 3 and the target 4. In this way it is possible to realize a more uniform film thickness disbtribution.

Figure 14:
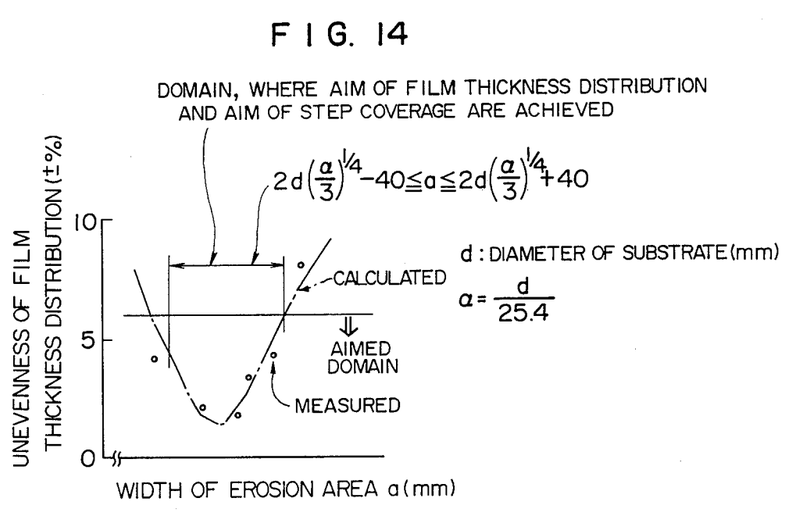
FIG. 14 shows film thickness distribution characteristics along the width of the erosion area in another embodiment of the present invention.
Figure 15:
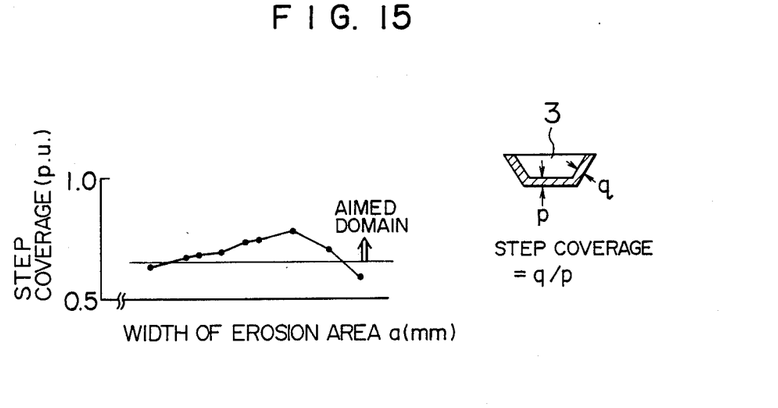
FIG. 15 shows step coverage characteristics along the width of the erosion area in another embodiment of the present invention.

Next, the width "a" of the erosion area satisfying both the uniform film thickness distribution and the step coverage will be explained. FIG. 14 indicates a calculated relationship between the width of the erosion area and the film thickness distribution, which shows V-shaped characteristics, i.e. the film thickness distribution has a minimum value for a certain width of the erosion area. FIG. 15 shows the relationship between the width of the erosion area and the step coverage, which indicates that the step coverage increases at first with increasing width of the erosion area and thereafter decreases. The smaller the unevenness of the film thickness distribution and the greater the step coverage is, the more preferable the characteristics of the film are. However, the upper limit of the unevenness of the film thickness distribution and the lower limit of the step coverage, which are usable, are indicated as aimed domains in FIGS. 14 and 15. The width of the erosion area satisfying both the aimed domain of the unevenness of the film thickness distribution indicated in FIG. 14 and that of the step coverage indicated in FIG. 15 is indicated also in FIG. 14. Although FIGS. 14 and 15 indicate calculated results obtained for a substrate having a diameter of 3", similar results have been obtained also for a substrate having a diameter of 5". The film thickness has been obtained by using the following equation;

$$dT = F_o \frac{1}{R^2} g(\alpha)\cos\beta \cdot dA_s$$

where T: film thickness at an arbitrary point P on the substrate.
$F_o$: constant relating to the sputter rate.
$dA_s$: infinitesimal area at an arbitrary point S of the erosion area.
R: distance between the point P and the point S.
α: angle formed by the segment SP and the normal to the target.
β: angle formed by the segment SP and the normal to the substrate, and
g(α): sputtered particle angular distribution function.

By integrating the above equation over the domain of the erosion area it is possible to obtain the film thickness T at the arbitrary point P on the substrate. The film thickness can be obtained by applying a measured emission distribution to g(α). Measured data (film forming conditions: supplied electric power 3 kW, sputtering gas is Ar, and the gas pressure is $2.7 \sim 4.0 \times 10^{-2}$ Pa) are also shown in FIG. 14, and they are in good accord with the calculated results. The width a of the erosion area satisfying both the aim of the unevenness of the film thickness distribution and that of the step coverage is in a domain comprised between 112 mm and 192 mm for a substrate having a diameter of 3". On the other hand, calculations for a substrate having a diameter of 5" indicate that the width a of the erosion area satisfies both the aims for a domain comprised between 132 mm and 212 mm. It can be seen from FIGS. 14 and 15 that in order to reduce the unevenness of the film thickness distribution, a value of "a" may be chosen at the neighborhood of the center of fluctuations; and, on the other hand, in order to increase the step coverage, a rather great value of "a" may be chosen. The domain of "a" described above, which is common to a substrate having a diameter of 3" and a substrate having a diameter of 5", can be summarized by the following equation:

$$2d\left(\frac{\alpha}{3}\right)^{\frac{1}{4}} - 40 \leq a \leq 2d\left(\frac{\alpha}{3}\right)^{\frac{1}{4}} + 40 \text{ (mm)}$$

where α=d/25.4 and d (mm) represents the length of the shorter side of the film forming region enveloping the substrates. It is obvious from the explanation described above that the domain of "a" represented by the above equation is applicable to substrates having diameters of 3" and 5" used currently in practice. However if the area of the film forming region has this order of magnitude, it can be applied satisfactorily to substrates having other shapes, independently of the size of the substrates.

By selecting the width of the erosion area within the domain described above a homogeneous film, whose unevenness of the film thickness distribution is small and whose step coverage is great, can be obtained on a plurality of substrates.

Figure 16:
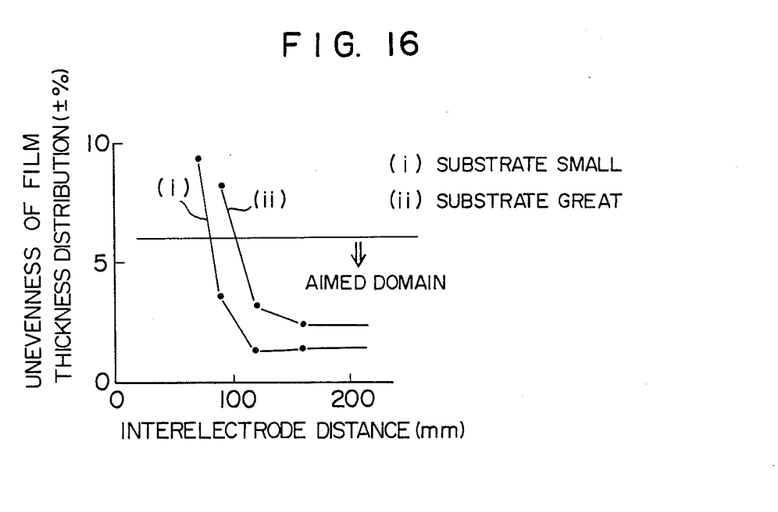
FIG. 16 shows characteristics illustrating the relation between the distance between the substrates and the target (interelectrode distance) and the film thickness distribution.

FIG. 16 shows the relationship between the interelectrode distance (distance between the substrates 3 and the target 4 in FIG. 1) and the film thickness distribution. Calculations have been effected for two types of substrate shapes having different sizes. The results show that, in order to form a film on a plurality of substrates with a small unevenness of the film thickness distribution, the interelectrode distance may be selected so as to be greater than 90 mm.

Consequently, if the interelectrode distance is greater than 90° mm, that the film can be formed with a small unevenness of the film thickness distribution.

Figure 17:
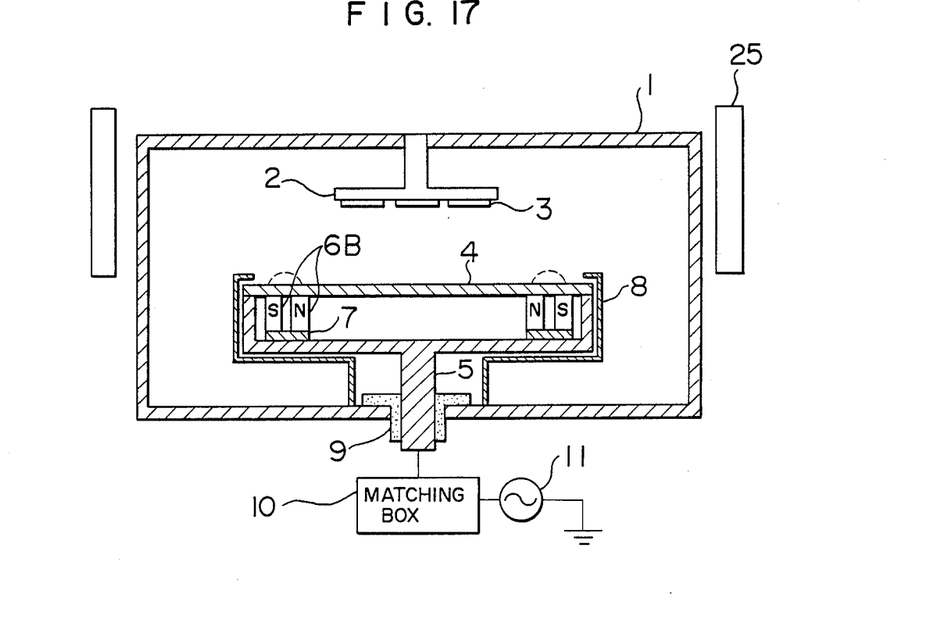
FIG. 17 is a cross-sectional view of another embodiment inducing a uniaxial magnetic anisotropy according to the present invention.

FIG. 17 illustrates another embodiment of the present invention. The apparatus indicated in this figure is rotated by 90° with respect to that indicated in FIG. 1, and the pipes 12 and 13 in FIG. 1 are not shown here. Differing from the apparatus indicated in FIG. 1, an example is illustrated here in which a Helmholtz coil 25 is disposed outside of the vacuum chamber 1 and a coil is used for inducing a uniaxial magnetic anisotropy in the film. Also, by using the apparatus indicated in this figure, if the width "a" of the erosion area is within the domain represented by the preceding equation, a film, in which the uniaxial magnetic anisotropy can be induced, can be obtained with a small unevenness of the film thickness distribution and a great step coverage.

Figure 18:
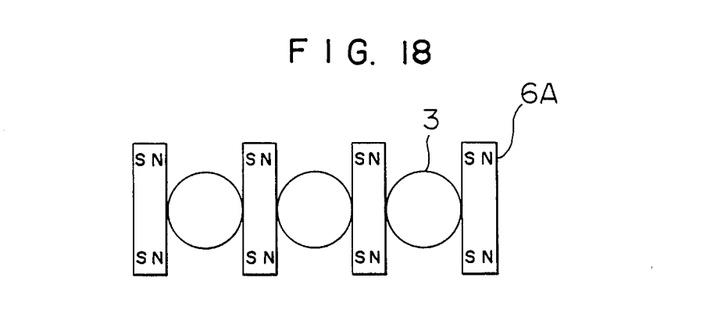
FIG. 18 shows the geometrical arrangement of the permanent magnets and the substrates in detail.

FIG. 18 illustrates in detail an arrangement of permanent magnets 6A, which gives the substrates 3 a unidirectional magentic field. By using this arrangement a similar effect can be obtained, if the width a of the erosion area is defined within the domain represented by the equation described above.

Figure 19:
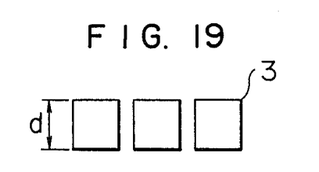
FIG. 19 shows an arrangement of quadrate substrates.

FIG. 19 illustrate an arrangement of quadrate substrates 3. In this case, since d in the preceding equation corresponds to the length d of one side in FIG. 19, calculations can be effected in the same way. In the case where the substrates are rectangular, d may represent the length of the longer side.

Figure 20:
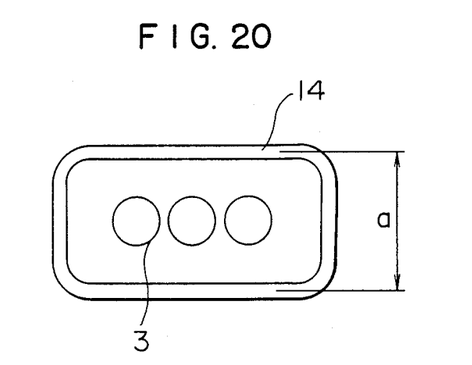
FIG. 20 is a plan view of an example where the erosion area has an elongated ellipse shape.

In FIG. 20, the shape of the erosion area 14 between the permanent magnets 6B indicated in FIG. 2 is an elongated ellipse, different from the rectangle indicated in FIG. 2. In this case also it is possible to form a homogeneous sputtered film on a plurality of substrates by defining the width a of the erosion area as stated previously.

Figure 21:
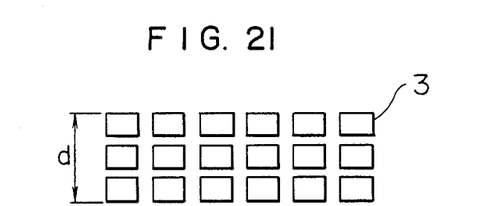
FIG. 21 shows an arrangement of substrates, where they are arranged in a plurality of rows.

FIG. 21 illustrates an arrangement of a plurality of substrates disposed in a plurality of rows. In this case d in the preceding equation is determined by the distance between the outermost sides of the substrates and a similar effect can be obtained by applying it to the preceding equation.

Now, when the length b of the erosion area 14 indicated in FIG. 2 is too small, the film thickness is greater at the outer substrates 3 than at the central substrate 3, and the film thickness distribution is worsened by influences of the sputtering from the shorter sides of the erosion area 14. The greater the length b of the erosion area 14 is, the more preferable it is from the point of view of the film thickness distribution and the step coverage. However, from the point of view of the design of the apparatus it is preferable that it is small. When n substrates 3 having a diameter of d (mm) are arranged on a straight line, if the length b of the erosion area 14 is equal to b=n.d, which is smallest, the film thickness distribution is bad. It has been known that it is preferable to locate the erosion area 14 at a position distant at least by 25 mm from the outermost substrates 3. When the distance between two adjacent substrates 3 is about midway between of 10 mm and 20 mm, the optimum value of b can be given by;

$$b \geq n(d+15)+50 \text{ (mm)}$$

and satisfactory results can be obtained within this domain from the point of view of the film thickness distribution and the step coverage.

Further, if a plurality of substrates 3 are arranged on a straight line, which is approximately in the middle of the two longer sides of the erosion area, all the substrates 3 can be influenced by the sputtering from the erosion area 14 composed of the longer sides to the same degree, they are hardly influenced by the erosion area 14 composed of the shorter sides, and thus it is possible to form a homogeneous film on a plurality of substrates 3.

Furthermore, the shape of the erosion area in the above explanation is not restricted to a rectangle or an elongated ellipse, but it may be a race track shape, and it is desirable to arrange the substrates, on which the film is to be formed, with a high efficiency within that region.

As explained above, since the magnetron sputter apparatus and the method for forming film by using the same according to the present invention are constituted as follows;

a magnetron sputter apparatus, in which a plurality of substrates are located on a straight line along the longitudinal direction of an erosion area with shorter and longer sides formed by a magnetron magnetic field on a target surface, each of them being located between two adjacent permanent magnets disposed with a predetermined interval on a substrate holder;

a magnetron sputter apparatus, in which the size of the longer side of the erosion area formed by the magnetron magnetic field on the target surface is greater than the value obtained by subtracting the distance between the target and the substrates from the length in the longitudinal direction of a film forming region enveloping the substrates;

a magnetron sputter apparatus, in which the size "a" of the shorter side of the erosion area formed by the magnetron magnetic field on the target surface is given by;

$$a = as \left( 1.7 + \frac{as}{bs} \times \frac{Ds - as}{10} \right) \pm \tfrac{1}{2} Ds$$

where "as" represents the size of the shorter side of the film forming region enveloping the substrates, "bs" the size of the longer side thereof, and "Ds" the distance between the target and the substrates;

a magnetron sputter apparatus, in which, in the case where the film deposited on the substrate includes an inclined portion, for which a sufficient film thickness is required, is arranged in the longitudinal direction of the erosion area formed by the magnetron magnetic field on the target surface, or when a straight line is traced, which passes through a longer side portion A of the erosion area formed by the magnetron magnetic field on the target surface and a portion P of the film forming region of the substrate, which is farthest from the longer side of the erosion area in the direction perpendicular to the longer side, the length of the segment AP being L, and a line perpendicular to the erosion area region is drawn towards the target, the angle formed by the perpendicular line and the straight line AP being $\theta$, L/$\theta$ has a value determined by 4±0.3, L being expressed in mm and $\theta$ in degree;

a magnetron sputter apparatus, in which, when the length of the shorter side of the film forming region enveloping the substrates is represented by d (mm), the shorter side of the erosion area with shorter and longer sides formed by the magnetron magnetic field on the target surface has a width a (mm) given by;

$$2d\left(\frac{\alpha}{3}\right)^{\frac{1}{4}} - 40 \leq a \leq 2d\left(\frac{\alpha}{3}\right)^{\frac{1}{4}} + 40 \text{ (mm)}$$

where $\alpha = d/25.4$;

a magnetron sputter apparatus, in which the length of the erosion area is b given by;

$$b \geq n(d+15) + 50 \text{ (mm)},$$

where n represents a number of the substrates and the length of the film forming region enveloping the substrates is d (mm);

a film forming method, by which a deposited film is formed simultaneously on a plurality of substrates arranged approximately on a straight line, each of which is located between adjacent permanent magnets positioned at a predetermined interval, in a state where a unidirectional magnetic field is formed on the surface of the substrates so that the magnetic field produced by the permanent magnets is approximately parallel to the direction of the substrate arrangement; or a film forming method, by which a parallel magnetic field is applied in the direction perpendicular to the direction of the substrate arrangement by means of at least a pair of permanent magnets disposed along the arrangement direction on both the sides of a plurality of the substrates arranged on a straight line, and a deposited film is formed simultaneously on the substrates in the state where a unidirectional magnetic field is formed on the surface of the substrates, it is possible to deposit a film of uniform characteristics having film forming characteristics excellent in the film forming distribution over large area simultaneously on a plurality of substrates, to assure a good step coverage, even if the film has an inclined portion, and further to achieve simultaneously both of them described above.

We claim:

1. A magnetron sputter apparatus comprising:
a vacuum chamber, whose interior is adapted to be hermetically sealed;
substrate support means located in said vacuum chamber and adapted to support a number of substrates, on the surfaces of which substrates a film is to be deposited;
target holder means for supporting a target so as to be opposite to said substrates, which target is adapted to serve as starting material for depositing the film; and
magnetron magnetic field generating means located on the side of said target opposite to said substrates and generating arch shaped magnetic lines of force on the side of said target facing towards said substrates;
wherein the size of a longer side of an erosion area, having longer and shorter sides, formed by said mangetron magnetic field generating means on said target surface is greater than the value obtained by subtracting the distance between said target and said substrates from the length in the longitudinal direction of a film forming region enveloping said substrates.

2. A magnetron sputter apparatus comprising:
a vacuum chamber, whose interior is adapted to be hermetically sealed;
substrate support means located in said
vacuum chamber and adapted to support a number of substrates, on the surfaces of which substrates a film is to be deposited;
target holder means for supporting a target located so as to be opposite to said substrates, said target being adapted to serve as starting material for depositing the film; and
magnetron magnetic field generating means located on the side of said target opposite to said substrates and generating arch shaped magnetic lines of force on the side of said target facing towards said substrates;
wherein the width a (mm), which is the length of the shorter side of an erosion area having longer and shorter sides formed on the surface of said target by said magnetron magnetic field generating means, is given by;

$$2d\left(\frac{\alpha}{3}\right)^{\frac{1}{4}} - 40 \leq a \leq 2d\left(\frac{\alpha}{3}\right)^{\frac{1}{4}} + 40 \text{ (mm)}$$

where $\alpha = d/25.4$ and d (mm) represents the length of the shorter side of a film forming region enveloping said substrates.

3. A magnetron sputter apparatus according to claim 2, wherein the shape of said erosion area is rectangular.

4. A magnetron sputter apparatus according to claim 2, wherein the shape of said erosion area is an elongated ellipse.

5. A magnetron sputter apparatus according to claim 2, further comprising Helmholtz coil means for applying a magnetic field to the surface of said substrates.

6. A magnetron sputter apparatus according to claim 2, further comprising permanent magnets means for applying a magnetic field to the surface of said substrates.

7. A magnetron sputter apparatus comprising:
a vacuum chamber, whose interior is adapted to be hermetically sealed;
substrate support means located in said vacuum chamber and adapted to support a number of substrates, on the surfaces of which substrates a film is to be deposited;
target holder means for supporting a target located so as to be opposite to said substrates, which target is adapted to serve as starting material for depositing the film; and
magnetron magnetic field generating means located on the side of said target opposite to said substrates and generating arch shaped magnetic lines of force on the side of said target facing towards said substrates;

wherein the length b (mm), which is the length of the longer side of an erosion area having longer and shorter sides formed on the surface of said target by said magnetron magnetic field generating means, is given by:

$$b \geq n(d+15)+50 \text{ (mm)}$$

where n represents said number of said substrates and d (mm) the length of the longer side of a film forming region enveloping said substrates.

8. A magnetron sputter apparatus according to claim 7, wherein the distance between said substrates and said target is greater than 90 mm.

9. A magnetron sputter apparatus comprising:
a vacuum chamber, whose interior is adapted to be hermetically sealed;
substrate support means located in said vacuum chamber and adapted to support a number of substrates, on the surfaces of which substrates a film is to be deposited;
target holder means for supporting a target located so as to be opposite to said substrates, said target being adapted to serve as starting material for depositing the film; and
magnetron magnetic field generating means located on the side of said target opposite to said substrates and generating arch shaped magnetic lines of force on the side of said target facing towards said substrates;
wherein the length a of the shorter side of an erosion area having longer and shorter sides formed by said magnetron magnetic field generating means on said target surface is given by;

$$a = as \left( 1.7 + \frac{as}{bs} \times \frac{Ds - as}{10} \right) \pm \tfrac{1}{4}Ds$$

where as represents the size of the shorter side of a film forming region enveloping said substrates, bs the size of the longer side thereof and Ds the distance between said target and said substrates.

10. A magnetron sputter apparatus comprising:
a vacuum chamber, whose interior is adapted to be hermetically sealed;
substrate support means located in said vacuum chamber and adapted to support a number of substrates, on the surfaces of which substrates a film is to be deposited;
target holder means for supporting a target located so as to be opposite to said substrates, which target is adapted to serve as starting material for depositing the film; and
magnetron magnetic field generating means located on the side of said target opposite to said substrates and generating arch shaped magnetic lines of force of the side of said target facing towards said substrates;
wherein, when a straight line is traced, which passes through a longer side portion A of an erosion area formed by said magnetron magnetic field generating means on said target surface and a portion P of a film forming region of said substrates, which is farthest from the longer side of said erosion area in the direction perpendicular to the longer side, the length of the segment AP being L, and a line perpendicular to said erosion area region is drawn towards the target, the angle formed by the perpendicular line and the straight line AP being $\theta$, $L/\theta$ has a value determined by $4 \pm 0.3$, L being expressed in mm and $\theta$ in degree.

11. A magnetron sputter apparatus comprising:
a vacuum chamber, whose interior is adapted to be hermetically sealed;
substrate support means located in said vacuum chamber and adapted to support a plurality of substrates, on the surfaces of which substrates a film is to be deposited, said substrate support means including substrate holding means for holding a plurality of said substrates in a straight line;
target holder means for supporting a target so as to be opposite to said substrates, said target to serve as starting material for depositing the film; and
magnetron magnetic field generating means located on the side of said target opposite to said substrates and generating arch shaped magnetic lines of force on the side of said target facing towards said substrates, the straight line in which the plurality of substrates are adapted to be held by the substrate holding means being a straight line along a longitudinal direction of an erosion area having longer and shorter sides formed on the surface of said target by said magnetron magnetic field generating means, and
wherein the size of the longer side of the erosion area is greater than the value obtained by subtracting the distance between said target and said substrates from the length in the longitudinal direction of a film forming region enveloping said substrates.

12. A magnetron sputter apparatus according to claim 11, wherein said substrate support means further includes a plurality of spaced apart permanent magnets so as to locate each of the plurality of substrates between two adjacent permanent magnets disposed with a predetermined interval on the substrate support means.

13. A method for forming films by using a magnetron sputter apparatus including a vacuum chamber, whose interior is kept hermetically sealed, a plurality of substrates located in said vacuum chamber and supported by a substrate holder so as to provide a substrate arrangement, on the surfaces of which substrates a film is deposited, a target located so as to be opposite to said substrates and supported by a target holder, said target serving as starting material for depositing the film, and magnetron magnetic field generating means located on the side of said target opposite to said substrates and generating arch shaped magnetic lines of force on the side of said target facing towards said substrates, comprising the steps of:
supplying electric power to said target;
generating plasma discharge while supplying sputter gas, sputtered particles traveling from said target to said substrates; and
forming the film from said sputtered particles on said plurality of substrates arranged approximately in a straight line, each of said substrates being disposed between two adjacent permanent magnets;
wherein a width a (mm), which is the length of a shorter side of an erosion area having longer and shorter sides formed on the surface of said target by a magnetron magnetic field generating means, is given by;

$$2d\left(\frac{\alpha}{3}\right)^{\frac{1}{4}} - 40 \leq a \leq 2d\left(\frac{\alpha}{3}\right)^{\frac{1}{4}} + 40 \text{ (mm)}$$

where $\alpha = d/25.4$ and d (mm) represents the length of the shorter side of a film forming region enveloping said substrates, and wherein the magnetic field produced by said permanent magnets is approximately parallel to the direction of the substrate arrangement and the magnetic field is unidirectional on the surface of said substrates.

14. A method of forming films by using a magnetron sputter apparatus including a vacuum chamber, whose interior is kept hermetically sealed, a plurality of substrates located in said vacuum chamber and supported by a substrate holder so as to provide a substrate arrangement, on the surfaces of which substrates a film is deposited, a target located so as to be opposite to said substrates and supported by a target holder, said target serving as starting material for depositing the film, and magnetron magnetic field generating means located on the side of said target opposite to said substrates and generating arch shaped magnetic lines of force on the side of said target facing said substrates, comprising the steps of:

supplying electric power to said target;

generating plasma discharge while supplying sputter gas, sputtered particles traveling from said target to said substrates; and forming the film from said sputtered particles simultaneously on said plurality of substrates arranged approximately in a straight line;

wherein a width a (mm), which is the length of a shorter side of an erosion area having longer and shorter sides formed on the surface of said target by a magnetron magnetic field generating means, is given by;

$$2d\left(\frac{\alpha}{3}\right)^{\frac{1}{4}} - 40 \leq a \leq 2d\left(\frac{\alpha}{3}\right)^{\frac{1}{4}} + 40 \text{ (mm)}$$

where $\alpha = d/25.4$, and d (mm) represents the length of the shorter side of a film forming region enveloping said substrates, and wherein a parallel magnetic field perpendicular to the substrate arrangement is applied to said substrates by using at least a pair of permanent magnets disposed on both sides of said substrates along the direction of the substrates arrangement, and the magnetic field is unidirectional on the surface of said substrates.

15. A method for forming films by using a magnetron sputter apparatus including a vacuum chamber, whose interior is kept hermetically sealed, substrates located in said vacuum chamber and supported by a substrate holder, on the surfaces of which substrates a film is deposited, a target located so as to be opposite to said substrates and supported by a target holder, which target serves as starting material for depositing the film, and magnetron magnetic field generating means located on the side of said target opposite to said substrates and generating arch shaped magnetic lines of force on the side of the target facing towards said substrates, comprising the steps of:

supplying electric power to said target;

generating a plasma discharge while supplying sputter gas, sputtered particles traveling from said target to said substrates; and forming the film from said sputtered particles on said substrates, the substrates, during the forming the film, being located in a straight line along a longitudinal direction of an erosion area, having longer and shorter sides, formed on the surface of said target by the magnetron magnetic field generating means;

wherein the size of the longer side of said erosion area formed by said magnetron magnetic field generating means on said target surface is greater than the value obtained by subtracting the distance between said target and said subtrates from the length in the longitudinal direction of a film forming region enveloping said substrates.

16. A method for forming films by using a magnetron sputter apparatus including a vacuum chamber, whose interior is kept hermetically sealed, substrates located in said vacuum chamber and supported by a substrate holder, on the surface of which substrates a film is deposited, the film having an inclined portion having an inclined part, a target located so as to be opposite to said substrates and supported by a target holder, which target serves as starting material for depositing the film, and magnetron magnetic field generating means located on the side of said target opposite to said substrates and generating arch shaped magnetic lines of force on the side of the target facing towards said substrates, comprising the steps of:

supplying electric power to said target;

generating a plasma discharge while supplying sputter gas, sputtered particles traveling from said target to said substrates; and forming the film from said sputtered particles on said substrates, the substrates, during the forming the film, being oriented such that the inclined part of the inclined portion of the film deposited on the substrate, for which a sufficient film thickness is required, is arranged in a longitudinal direction of an erosion area formed on the surface of said target by the magnetron magnetic field generating means.

17. A magnetron sputter film forming method according to claim 16, wherein the film deposited on the substrates and having the inclined portion consists of a lower magnetic film deposited on a flat portion of said substrate and an upper magnetic film deposited so that a portion covering a coil disposed in an insulating layer placed at an end portion of said lower magnetic film forms a convex portion including the inclined portion.

* * * * *